United States Patent [19]

Polichette et al.

[11] 3,959,547

[45] *May 25, 1976

[54] PROCESS FOR THE FORMATION OF REAL IMAGES AND PRODUCTS PRODUCED THEREBY

[75] Inventors: Joseph Polichette, South Farmingdale; Edward J. Leech, Oyster Bay, both of N.Y.

[73] Assignee: Photocircuits Division of Kollmorgen Corporation, Glen Cove, N.Y.

[ * ] Notice: The portion of the term of this patent subsequent to Nov. 13, 1990, has been disclaimed.

[22] Filed: Aug. 13, 1973

[21] Appl. No.: 387,587

Related U.S. Application Data

[62] Division of Ser. No. 167,435, July 29, 1971, Pat. No. 3,772,078.

[52] U.S. Cl. .................................. 428/209; 427/98; 427/256; 427/287; 427/288; 427/304; 427/305; 427/306; 427/404; 428/210; 428/211

[51] Int. Cl.² ............................................ B32B 3/10

[58] Field of Search ................ 117/5.5, 35 S, 37 R, 117/45, 47 A, 47 R, 62, 63, 71 R, 124 C, 130 E, 138.8 R, 152, 212, 227; 204/38 B; 106/1; 427/88, 92, 96, 97, 98, 256, 287, 288, 304–306, 402, 404, 405, 419; 428/195, 209, 210, 211

[56] References Cited

UNITED STATES PATENTS

| 3,259,559 | 7/1966 | Schneble et al. ................. 117/62 X |
| 3,310,430 | 3/1967 | Schneble et al. ................. 117/130 E |
| 3,562,005 | 2/1971 | De Angelo et al. ................. 117/212 |
| 3,619,285 | 11/1971 | Feldstein ............................. 117/212 |
| 3,650,911 | 3/1972 | Lin .............................. 117/160 R X |
| 3,672,925 | 6/1972 | Feldstein ............................. 117/5.5 |
| 3,672,939 | 6/1972 | Miller .......................... 117/130 B X |

*Primary Examiner*—Thomas J. Herbert, Jr.
*Assistant Examiner*—Bruce H. Hess
*Attorney, Agent, or Firm*—Morgan, Finnegan, Pine, Foley & Lee

[57] ABSTRACT

Non-conductive real images are formed on substrates by depositing reducible metal salt compositions thereon and exposing the coated substrates to radiant energy or a chemical reducing agent to reduce the metal salt to metallic nuclei and to produce a real image of metal, which is made clearer and built up by electroless metal deposition. The metal salt composition can either be selectively deposited and then exposed, or uniformly deposited and then selectively exposed, to produce the real image.

21 Claims, No Drawings

PROCESS FOR THE FORMATION OF REAL IMAGES AND PRODUCTS PRODUCED THEREBY

This is a division of application Ser. No. 167,435, filed July 29, 1971, now U.S. Pat. No. 3,772,078.

This invention relates to novel and improved methods for selectively metallizing bodies and to the products which result from such methods.

More particularly, the present invention relates to imposing, by thermal, radiant energy or chemical reduction methods, real images comprising non-conductive metallic areas on the surfaces of such bodies. Such images are then made clearer and built up with deposits of electroless metal.

Although applicable whenever it is desired to apply a metallic coating to a substrate, as for example, for decorative or protective effects, or to make electrical conductors of a wide variety of shapes and configurations, the procedures for metallization herein are particularly useful for making real images on a variety of base materials, e.g., resinous insulating laminated bases or porous non-conductive materials, e.g., cloth, fiberglass, paper, cardboard, ceramics and the like.

It is a primary object of this invention to provide a process to produce real images on substrates, which can be built up by electroless plating and, optionally, subsequent electroplated metal deposition.

Another principal object of this invention is to provide improvements in metallization processes in which a base is selectively sensitized to metallization by electroless plating.

An additional object of this invention is to provide base materials and processes for selective electroless metallization in which there are employed non-noble metal sensitizers which are much more economical in cost, but equivalent in performance to the noble metal-containing sensitizers used until now.

Another object of this invention is to provide adherent electroless metal coatings bonded in selected areas to base materials.

The desired selectivity can be obtained according to this invention either by treating predetermined areas of the substrate by well-known techniques such as printing, free-hand drawing, lithographing, silk screening, embossing with textile rollers, and the like, or by treating the entire surface and selectively exposing predetermined areas through a mask, through negatives, with heated dies, and the like.

It has now been discovered that an electroless metal deposit can be selectively and adherently applied to a substrate. The method uses a real image in selected areas on the surface, the image being catalytic to the build up of a metal layer thereon by electroless metal deposition. The real image comprises a nonconductive layer of metal nuclei. Although the process can produce real images or prints of any kind, its selectivity facilitates the production of current conductor lines, plates or terminals, as in the manufacture of printed circuits and contributes to the decorative or design process, as in the manufacture of name plates dials and other metallized plastics. In all cases, when following the teachings herein, there are obtained outstanding, unexpectedly high bond strengths between the electroless metal and the base, as well as excellent resolution of the image formed.

DESCRIPTION OF THE INVENTION

According to the present invention substrates are metallized by either i. providing selected areas of the substrate with a layer of a metal salt or metal salt composition which on exposure to radiant energy or a chemical reducing agent is converted to metallic nuclei and exposing the layer to radiant energy or a chemical reducing agent to produce a non-conducting, real image of a desired pattern or ii. providing the substrate with a layer of a metal salt or metal salt composition which on selective exposure to radiant energy or a chemical reducing agent is converted into metal nuclei and exposing the layer to radiant energy or a chemical reducing agent to produce a non-conducting, real image of a desired pattern, and building up the pattern by contacting the metallic nuclei with an electroless metal deposition solution.

In carrying out the present invention, the substrate is cleaned, if necessary, then provided with a layer of the metal salt or metal salt composition, e.g., by printing or otherwise marking selected areas of the substrate, e.g., with a solution of the salt or the salt composition, or by use of suitable masking to protect the areas which are to be free of the image deposit during as well as after the coating and reduction. On the other hand, the entire substrate may be covered with a layer of the metal salt or metal salt composition and selected areas only may be reduced by expedients such as exposure to radiant energy through a mask or by application of a heated die, or by exposure to a reducing agent after protection by a resist, and the like.

Among the materials which may be used in this invention are inorganic and organic substances, such as glass, ceramic, porcelain, resins, paper, cloth, and the like. Unclad laminated resinous structures, molded resins and laminated resins may also be used.

Among the materials which may be used as the bases, may be mentioned unclad insulating thermosetting resins, thermoplastic resins and mixtures of the foregoing, including fiber, e.g., fiber glass, impregnated embodiments of the foregoing.

Included in the thermoplastic resins are acetal resins; acrylics, such as methyl acrylate, cellulosic resins, such as ethyl cellulose, cellulose acetate, cellulose propionate, cellulose acetate butyrate, cellulose nitrate, and the like; polyethers; nylon; polyethylene; polystyrene; styrene blends, such as acrylonitrile styrene copolymers and acrylonitrile-butadiene styrene copolymers; polycarbonates; polychlorotrifluoroethylene; and vinyl polymers and copolymers, such as vinyl acetate, vinyl alcohol, vinyl butyral, vinyl chloride, vinyl chloride-acetate copolymer, vinylidene chloride and vinyl formal.

Among the thermosetting resins may be mentioned allyl phthalate; furane, melamine-formaldehyde; phenol formaldehyde and phenol furfural copolymers, alone or compounded with butadiene acrylonitrile copolymers or acrylonitrile-butadiene-styrene copolymers; polyacrylic esters; silicones; urea formaldehydes; epoxy resins; allyl resins; glyceryl phthalates; polyesters; and the like.

Porous materials, comprising paper, wood, Fiberglas, cloth and fibers, such as natural and synthetic fibers, e.g., cotton fibers, polyester fibers, and the like, may also be metallized in accordance with the teachings herein. The invention is particularly applicable to the metallization of resin, e.g., epoxy resin, impregnated fibrous structures and varnish, e.g., epoxy resin varnish, coated resin impregnated fiber structures of the type described.

The substrates selectively covered with a real image comprising catalytic metal nuclei generically will include any insulating material so covered, regardless of shape or thickness, and includes thin films and strips as well as thick substrata.

The bases referred to herein are inorganic or organic materials of the type described which have a real image in the form of a surface layer comprising metallic nuclei which are catalytic to the reception of electroless metal, "catalytic" in this sense referring to an agent which is capable of reducing the metal ions in an electroless metal deposition solution to metal.

The real images produced herein comprise metallic muclei in which the metals are selected from Groups VIII and IB of the Periodic Table of Elements. These include gold, silver, iridium, platinum, palladium, rhodium, copper, nickel, cobalt and iron. Preferred metals are selected from Period 4 of Groups VIII and IB: iron, cobalt, nickel and copper. Especially preferred for the production of the real image is copper.

If desired, the substrate can be coated with an adhesive before being coated with the compositions of this invention.

In producing the real image, the metal is reduced from its salt or a composition of the salt in situ in selected areas on the surface of the base by application of radiant energy, e.g., heat or light, such as ultraviolet light and visible light, x-rays, electron beams, and the like, or by treatment with a chemical reducing agent.

In one manner of proceeding, a solution of a heat-reducible metal salt, e.g., cupric formate, and optionally a developer, e.g., glycerine, and a surfactant in water is selectively coated onto the base, dried and heated, e.g., at 100° to 170°C., preferably at 130° to 140°C., until the surface layer has darkened in color, indicating the metallic salt has been reduced to a non-conductive real image comprising, e.g., copper, nickel, cobalt or iron nuclei. The base is now catalytic to the deposition of electroless metal, e.g., copper, nickel, cobalt, gold or silver, on the surface of the base and on the walls in any holes in the base. Alternatively, the entire base is provided with a layer of the salt and the image is formed by heating selected areas, as with a hot die.

In more detail, according to such a heat-activation process, the base, if necessary, is cleaned and pretreated by one of the methods to be described. The clean base is printed in selected areas with one of the metal salt solutions, to be described in detail hereinafter, for a short time, e.g., 1–3 minutes. The base and layer thereon is then placed in a heated area, e.g., an over for 10 to 20 minutes, or until the metal salt is reduced to form a real image comprising metallic nuclei. The temperature of heating can range from 100° to 170°C., but the preferred range is 130°–140°C. The reduction is considered complete when the coating has darkened in color. The base with the image thereon is then removed from the heated area and allowed to cool. The image is catalytic to electroless metal deposition and can be processed in known ways, as will be described hereinafter, for the subsequent build-up of electroless metal plating and, optionally, a top layer of electroplating. Alternatively, the entire base can be provided with a layer of the metal salt and the image produced by heating selected areas.

In another manner of proceeding, a solution of a metal salt composition, e.g., cupric formate, and a light-sensitive reducing agent, a second reducing agent, and optionally (for hard to wet surfaces) a surfactant, in water or an organic solvent, such as an alcohol, dimethyl formamide, dimethyl sulfoxide, and the like, is selectively printed on the base, dried and exposed to ultraviolet light radiation to form a real image of metallic nuclei. Suitable light-sensitive reducing agents are aromatic diazo compounds, ferric salts, e.g., ferric oxalate, ferric ammonium sulfate, dichromates, e.g., ammonium dichromate, anthraquinone disulfonic acids or salts thereof, glycine (especially active under humid surface conditions), L-ascorbic acid, azide compounds, and the like, as well as metal accelerators, e.g., tin compounds, e.g., stannous chloride, or compounds of silver, palladium, gold, mercury, cobalt, nickel, zinc, iron, etc., the latter group optionally being added in trace amounts of 1 mg. to 2 g. per liter. Among the second reducers are polyhydroxy alcohols, such as glycerol, ethylene glycol, pentaerythritol, mesoerythritol, 1,3-propanedio, sorbitol, mannitol, propylene glycol, 1,2-butane-diol, pinacol, sucrose, dextrin, and compounds such as triethanol-amine, propylene oxide, polyethylene glycols, lactose, starch, ethylene oxide and gelatin. Compounds which are also useful as secondary reducers are aldehydes, such as formaldehyde, benzal-dehyde, acetaldehyde, n-butyraldehyde, polyamides, such as nylon, albumin and gelatin; leuco bases of triphenylmethane dyes, such as 4-dimethylamino triphenylmethane, 4,4',4''-tris-dimethylamino-triphenylmethane; leuco bases of xanthene dyes, such as 3,6-bis dimethylamino xanthene and 3,6-bis dimethylamino-9-(2-carboxy-ethyl)xanthene; polyethers, such as ethylene glycol diethyl ether, diethylene glycol diethyl ether, tetraethylene glycol dimethyl ether, and the like. Among the suitable surfactants are polyethenoxy nonionic ethers, such as Triton X-100, manufactured by Rohm & Haas Co., and nonionic surfactants based on the reaction between nonyl phenol and glycidol, such as Surfactants 6G and 10G manufactured by Olin Mathieson Company.

After exposure of ultraviolet light radiation for a short time the reduction to metallic nuclei is generally complete. Sometimes, the reduction can be further enhanced by heating at a temperature of up to about 130°C. for a few minutes more.

Alternatively, instead of selectively printing, if the base is coated all over with the metal salt composition and exposed through a positive or negative of an original pattern or photograph, there will form a real image on selected portions of the surface from which the background can be removed by washing out the unexposed (unreduced) portion of the metal layer, e.g., in running water for about 5 to 10 minutes. The real image on the base is reinforced by deposition of electroless metal from a solution onto the image so as to build up metal on the base and, in suitable instances, on the walls in any holes in the base in which metal nuclei have been formed by exposure to ultraviolet light.

In still another manner of proceeding, a metal salt composition, e.g., cupric formate, cupric gluconate, cupric acetate, cupric chloride, nickelous chloride, cobaltous chloride or ferrous sulfate in aqueous or non-aqueous solution, e.g., water, dimethyl formamide, ethyl acetate, trichloroethane, n-butanol, methanol, and the like, optionally containing glycerine and surface active agents, is selectively coated onto the base, dried and exposed to a chemical reducing agent, e.g., an alkali metal borohydride, e.g., sodium or potassium borohydride, an alkali metal hydrosulfite, e.g., sodium hydrosulfite, or an amine borane, e.g., dimethyl-amine borane or morpholine borane, in an aqueous or non-aqueous solvent, e.g., water or methanol, for about 1 to 2 minutes or until the formation of a real image comprising reduced metallic nuclei is complete. After the base is rinsed free of chemical reagents, e.g., with water, the image is exposed to a solution for the deposition of electroless metal to build up metal on the surface of the base over the image and on the walls in any holes in the base in which the reduced metal nuclei are arranged. Alternatively, the base can be coated over its entire surface with the metal salt composition and then selectively exposed to the reducing agent to produce the real image.

In more detail, in such a chemical reduction process, the base, if necessary, will be cleaned and roughened by methods to be described later. The base is then selectively coated with one of the metal salt solutions, to be described, for a short time, e.g., 1–5 minutes and allowed to dry. The drying rate is not critical but it is dependent on the method of drying and the temperature used. Temperatures above 170°C. are not preferred, however. In non-aqueous systems, the drying rate can be regulated by the type of solvent system used. For example, 1,1,1-trichloro-ethane and ethyl acetate dry rapidly in air and thus require little or no heat for quick complete drying.

In all cases the coating of metal salts should be dry before selective exposure to radiant energy and preferably dry before exposure to reducing agents, as the case may be. Otherwise images may reverse. In all such embodiments, the metal accelerators described above will provide enhanced rates of image formation.

The base having a layer of the dry metal salt thereon is next immersed into a chemical reducing solution, of the type to be described, for about 1–2 minutes or until the base is substantially darkened in color. This indicates that the metal salt has been reduced to the real image, comprising free metal nuclei, e.g., copper, nickel, cobalt or iron. These portions of the substrate are now catalytic to the deposition of electroless metal.

The base is then rinsed in running water for a short time, e.g., 3–5 minutes. Finally, the base is immersed into an electroless metal bath to build up the image by deposition of electroless metal and, if desired, an electroplated metal deposit is finally put down as a top layer.

Typically, the autocatalytic or electroless metal deposition solutions for use in depositing electroless metal on the bodies having a real image comprised of catalytic metal nuclei prepared as described herein comprise an aqueous solution of a water soluble salt of the metal or metals to be deposited, a reducing agent for the metal cations, and a complexing or sequestering agent for the metal cations. The function of the complexing or sequestering agent is to form a water soluble complex with the dissolved metallic cations so as to maintain the metal in solution. The function of the reducing agent is to reduce the metal cation to metal at the appropriate time.

Typical of such solutions are electroless copper, electroless nickel, electroless cobalt, electroless silver and electroless gold solutions. Such solutions are well known in the art and are capable of autocatalytically depositing the identified metals without the use of electricity.

Typical of the electroless copper solutions which may be used are those described in U.S. Pat. No. 3,095,309, the description of which is incorporated herein by reference. Conventionally, such solutions comprise a source of cupric ions, e.g., copper sulfate, a reducing agent for cupric ions, e.g., formaldehyde, a complexing agent for cupric ions, e.g., tetrasodium ethylenediaminetetraacetic acid, and a pH adjustor, e.g., sodium hydroxide.

Typical electroless nickel baths which may be used are described in Brenner, *Metal Finishing*, Nov. 1954, pages 68 to 76, incorporated herein by reference. They comprise aqueous solutions of a nickel salt, such as nickel chloride, an active chemical reducing agent for the nickel salt, such as the hypophosphite ion, and a complexing agent, such as carboxylic acids and salts thereof.

Electroless gold plating baths which may be used are disclosed in U.S. Pat. No. 2,976,181, hereby incorporated herein by reference. They contain a slightly water soluble gold salt, such as gold cyanide, a reducing agent for the gold salt, such as the hypophosphite ion, and a chelating or complexing agent, such as sodium or potassium cyanide. The hypophosphite ion may be introduced in the form of the acid or salts thereof, such as the sodium, calcium and the ammonium salts. The purpose of the complexing agent is to maintain a relatively small portion of the gold in solution as a water soluble gold complex, permitting a relatively large portion of the gold to remain out of solution as gold reserve. The pH of the bath will be about 13.5 or between about 13 and 14, and the ion ratio of hypophosphite radical to insoluble gold salt may be between about 0.33 and 10:1.

A typical electroless cobalt bath is described in the Examples.

A useful electroless silver bath is described in the Examples.

A specific example of an electroless copper deposition bath suitable for use is as follows:

|  | Moles/liter |
|---|---|
| Copper sulfate | 0.03 |
| Sodium hydroxide | 0.12 |
| Sodium cyanide | 0.0004 |
| Formaldehyde | 0.08 |
| Tetrasodium ethylenediaminetetraacetate | 0.036 |
| Water | Remainder |

This bath is preferably operated at a temperature of about 55°C. and will deposit a coating of ductile electroless copper about 1 mil thick in about 51 hours.

Utilizing the electroless metal baths of the type described, very thin conducting metal films or layers will be laid down on the image comprising metal nuclei. Ordinarily, the metal films super-imposed on the image of metal nuclei by electroless metal deposition will range from 0.1 to 7 mils in thickness, with metal films having a thickness of even less than 0.1 mil being a distinct possibility.

Among its embodiments, the present invention contemplates metallized substrates in which the electroless metal, e.g., copper, nickel, cobalt, silver, gold or the like, has been further built up by attaching an electrode to the electroless metal surface and electrolytically, i.e., galvanically depositing on it more of the same or different metal, e.g., copper, nickel, cobalt, silver, gold, rhodium, tin, alloys thereof, and the like. Electrolytic plating procedures are conventional and well known to those skilled in the art.

For example, a pyrophosphate copper bath is commercially available for operation at a pH of 8.1 to 8.4, a temperature of 50°C., and a current density of 50 amp./sq.ft. In addition, a suitable fluoborate copper bath is operated at a pH of 0.6 to 1.2, a temperature of 25°–50°C., and a current density of 25 to 75 amp. per sq. ft. and is comprised of:

| | |
|---|---|
| copper fluoborate $Cu(BF_4)_2$ | 225 – 450 g./l. |
| fluoboric acid, $HBF_4$ | 2 – 15 g./l. |
| boric acid, $H_3BO_3$ | 12 – 15 g./l. |

For printed circuit application, copper deposits for use as the basic conductor material are usually 0.001 to 0.003 in. thick.

Silver may be deposited electrolytically from a cyanide bath operated at a pH of 11.5 to 12, a temperature of 25°–35°C., and a current density of 5–15 amp./sq.ft. An illustrative electrolytic silver bath is comprised of:

| | |
|---|---|
| silver cyanide, AgON | 50 g./l. |
| potassium cyanide, KCN | 110 g./l. |
| potassium carbonate, $K_2CO_3$ | 45 g./l. |
| brighteners | Variable |

Gold may be deposited electrolytically from an acid gold citrate bath at pH 5–7, a temperature of 45°–60°C., and a current density of 5–15 amp./sq.ft. An illustrative electrolytic gold bath consists of:

| | |
|---|---|
| Sodium gold cyanide, $NaAu(CN)_2$ | 20 – 30 g./l. |
| dibasic ammonium citrate $(NH_4)_2C_6H_5O_7$ | 25 – 100 g./l. |

Nickel can be electrolytically deposited at pH 4.5 to 5.5, a temperature of 45°C., and a current density of 20 to 65 amp./sq.ft. the bath containing:

| | |
|---|---|
| nickel sulfate, $NiSO_4.6H_2O$ | 240 g./l. |
| nickel chloride, $NiCl_2.6H_2O$ | 45 g./l. |
| boric acid, $H_3BO_3$ | 30 g./l. |

Tin and rhodium and alloys can be electrolytically deposited by procedures described in Schlabach et al, Printed and Integrated Circuitry, McGraw-Hill, New York, 1963, p. 146–148.

It is essential in carrying out the process of this invention to use a clean substrate — otherwise adhesion, as measured by the work needed to peel the electroless metal from the substrate, will be non-existent. Resinous bases will benefit from chemically cleaning and/or polarizing the surface. With adsorbent substrates, e.g., glass cloth, fabrics paper and the like, no special pre-treatment is required, but the surface must be clean.

If the base is a resinous laminate, e.g., having holes drilled through or punched therein, conventional cleaning methods are used to remove all contaminants and loose particles. The surface should be "chemically clean", i.e., free of grease, and surface films. A simple test is to spray the surface with distilled water. If the surface is chemically clean, the water will form a smooth film. If not, the water will break into droplets.

A base can be made clean by scrubbing with pumice or the like to remove heavy soils; rinsing with water; and subsequently removing soiling due to organic substances with a suitable alkaline cleaning composition, e.g.:

| | |
|---|---|
| sodium isopropyl naphthalene sulfonate | 3 g./l. |
| sodium sulfate | 1 g./l. |
| sodium tripolyphosphate | 14 g./l. |
| sodium metasilicate | 5 g./l. |
| tetrasodium pyrophosphate | 27 g./l. |

This operation is desirably performed at 160°–180°F. The surfaces are exposed to the bath for 5 to 30 minutes. Other suitable alkali cleaning compositions, detergents and soaps may be used, taking care in the selection not to have the surface attacked by the cleaner. If present, surface oxides can be removed from metal surfaces with light etchants, such as 25% ammonium persulfate in water, or the cupric chloride etchant of U.S. Pat. No. 2,908,557. On the other hand, if the shape of the base permits, a sanding operation with fine abrasive can also be used to remove oxides.

Some resinous substrates, e.g., epoxy resin impregnated fibrous structures and epoxy resin varnish coted resin impregnated fiber structures benefit from an additional surface treatment, e.g., the direct bonding pretreatment process of copending U.S. Ser. No. 72,582, filed Sept. 16, 1970, incorporated by reference. This helps to achieve strong adhesion of electroless metal deposits to such bases.

This generally comprises treating the base with a suitable organic or inorganic acid, e.g., chromic acid and/or sulfuric acid or a base solution to render it porous. In many cases it is desirable to also treat the surface with an agent, e.g., dimethyl formamide or dimethyl sulfonide before or during the etching process. The effect of such treatments is to render the surface temporarily polar.

Depending upon the particular insulating bases involved, other in exchange imparting materials may be utilized to effect the aforementioned polarization reaction. For example, acidified sodium fluoride, hydrochloric and hydrofluoric acids, chromic acid, borates, fluoroborates and caustic soda, as well as mixtures thereof, have been found effective to polarize the various synthetic plastic resin insulating materials described herein.

In a typical procedure, after treatment with the polarization agents, such resinous insulating bodies are rinsed so as to eliminate any residual agents, following which they are immersed in a solution containing a wetting agent, the ions of which are base exchanged with the surface of the insulating base to thereby impart to the base relatively long chained ions which also are capable of chemically linking with precious metal ions or ionic complexes containing precious metal ions. Following treatment with the wetting agent, the insulating bodies are rinsed again so as to eliminate the residual wetting agent solution.

DESCRIPTION OF THE PREFERRED EMBODIMENTS.

The following examples illustrate the methods and articles of this invention. They are not to be construed to limit the invention in any manner whatsoever.

EXAMPLE 1

An epoxy-glass laminate having holes drilled in it for through hole connections is cleaned with a hot alkaline cleaner of the type described above, and all loose particles are removed.

A diagram is block printed on the clean laminate using as the "ink" a solution of the following formulation:

| | |
|---|---|
| cupric formate | 10 g. |
| anthraquinone 2,6-disulfonic acid disodium salt | 2 g. |
| water | 100 ml. |
| glycerine | 1 g. |

The printed substrate is placed in an oven for 10–20 minutes at 130°–140°C. to produce a real image by reducing the copper salt to copper nuclei.

The substrate having a darkened real image on its surface is removed from the oven and allowed to cool.

An electroless copper layer is deposited on the real image by immersing the substrate in a bath at 55°C., the bath having the following composition:

| | |
|---|---|
| cupric sulfate | 0.03 moles/l. |
| sodium hydroxide | 0.125 moles/l. |
| sodium cyanide | 0.0004 moles/l. |
| formaldehyde | 0.08 moles/l. |
| tetrasodium ethylenediamine tetraacetate | 0.036 moles/l. |
| water | Remainder |

Selected areas of the base, corresponding to the real image, and the walls of the holes in the base are covered with a firmly adherent layer of bright, ductile electrolessly deposited copper.

The procedure is relocated, except that the entire base is dip-coated with the metal salt solution and air dried. The real image is formed by applying a heated die to the surface, the elevated portions of the die in contact with the surface heating selected areas thereof. A substantially similar article is obtained

EXAMPLE 2

The procedure of Example 1 is repeated substituting for the laminated base, an unclad epoxy impregnated glass fiber laminate (Westinghouse M-6528). The base is activated as follows:

a. Treat the surface of the base by dipping in dimethyl formamide (DMF, sp.gr. 0.947–0.960 at 24°C.) for 5 minutes, and drain for 15 seconds.
b. Solvent rinse the base in 9 parts by volume, of ethyl acetate and 1 part by volume DMF (sp.gr. 0.900–0.922 at 24°C.) with occasional rack agitation to clear the holes for 30 seconds, and the drain for 15 seconds.
c. Repeat step (b) in a second solvent rinse tank, drain 15 seconds, then allow parts on rack load to air dry for 2 minutes.
d. Treat the base in a bath comprising:

| | |
|---|---|
| CrO$_3$ | 80 – 100 g./l. |
| Conc. H$_2$SO$_4$ | 200 – 250 ml./l. |
| Fluorocarbon wetting agent (3-M Company, FC-95) | 0.5 g./l. | at 40°–45°C. with gentle agitation of the solution for 5 minutes and drain for 15 seconds.

e. Neutralize the base with potassium bisulfate solution for 1–2 minutes.
f. Rinse the polarized base for 5 minutes.

The selected areas of the activated base are covered with a real image and an electroless copper layer is deposited on the image by the procedure of Example 1.

EXAMPLES 3 and 4

The procedure of Example 1 is repeated, substituting an activated epoxy glass laminate as the base (Example 2) and the images are formed from metal salt baths of the following compositions:

EXAMPLE 3

| | |
|---|---|
| cupric formate | 10 g. |
| dimethyl formamide | 100 ml. |
| anthraquinone 2,6-disulfonic acid disodium salt | 6 g. |
| wetting agent (Rohm and Haas, Triton X-100) | 1 g. |

EXAMPLE 4

| | |
|---|---|
| cupric formate | 10 g. |
| water | 100 ml. |
| glycerine | 6 g. |
| surface active agent (Triton X-100) | 1 g. |

There are obtained electrolessly metallized substrates according to this invention.

EXAMPLE 5

A clean epoxy-glass laminate polarized according to the procedure of Example 2 is block printed in selected areas with a metal salt composition of the following formulation:

| | |
|---|---|
| cupric gluconate | 12.5 g. |
| surface active agent (Triton X-100) | 0.2 g. |
| glycerine | 70.0 g. |
| citric acid | 70.0 g. |
| stannous chloride | 1.0 g. |
| anthraquinone 2,6-disulfonic acid disodium salt | 6.0 g. |
| water (to make) | 1 liter |

The substrate is allowed to dry thoroughly.

The dry metallic compound printed substrate is immersed for 1–2 minutes into a reducing solution of the formulation:

| | |
|---|---|
| sodium borohydride | 10 g. |
| water (to make) | 1000 ml. |

The substrate, the surface of which has substantially a darkened real image of deposited metallic copper nuclei, is rinsed in running water for 3–5 minutes.

The real image substrate is then built up with a layer of electroless copper by immersing it into an electroless plating bath as described in Example 1.

EXAMPLES 6 – 15

The procedure of Example 5 is repeated, substituting for the cupric gluconate salt solution, the following metal salts or compositions of metal salts:

EXAMPLE 6

| | |
|---|---|
| cupric acetate | 4.0 g. |
| surface active agent | |

-continued

| | | |
|---|---|---|
| (Triton X-100) | 0.8 | g. |
| citric acid | 20.0 | g. |
| glycerine | 40.0 | g |
| anthraquinone 2,6-disulfonic acid disodium salt | 8.0 | g. |
| sorbitol | 60.0 | g. |
| stannous chloride | 0.4 | g. |
| water (to make) | 500.0 | ml. |

EXAMPLE 7

| | | |
|---|---|---|
| cupric acetate | 5 | g. |
| ethyl acetate (to make) | 1 | liter |

EXAMPLE 8

| | | |
|---|---|---|
| cupric chloride | 2.0 | g. |
| methanol (to make) | 1 | liter |

EXAMPLE 9

| | | |
|---|---|---|
| cupric acetate | 1.0 | g. |
| ethyl acetate | 200 | ml. |
| 1,1,1-trichloroethylene | 800 | ml. |

EXAMPLE 10

| | | |
|---|---|---|
| cupric acetate | 4.0 | g. |
| surface active agent (Triton X-100) | 0.8 | g. |
| water (to make) | 500 | ml. |

EXAMPLE 11

| | | |
|---|---|---|
| silver nitrate | 1 | g. |
| acetone (to make) | 1000 | ml. |

EXAMPLE 12

| | | |
|---|---|---|
| nickelous chloride | 1 | g. |
| water (to make) | 700 | ml. |

EXAMPLE 13

| | | |
|---|---|---|
| cobaltous chloride | 1 | g. |
| water (to make) | 700 | ml. |

EXAMPLE 14

| | | |
|---|---|---|
| ferrous sulfate | 30 | g. |
| water | 100 | ml. |
| sulfuric acid (to pH 2.0) | | |

EXAMPLE 15

| | | |
|---|---|---|
| ferrous sulfate | 30 | g. |
| methanol | 1000 | ml. |

The metal salts on the dry, coated substrates are reduced to real images comprising the respective metallic nuclei with the sodium borohydride solution and an electroless copper layer is deposited thereon by the procedure of Example 1. It is to be noted that, in addition to copper metal nuclei, there are employed silver (Example 11), nickel (Example 12), cobalt (Example 13) and iron (Examples 14 and 15) nuclei.

EXAMPLES 16 – 18

The procedure of Example 5 is repeated, substituting the following reducing solutions for sodium borohydride in water:

EXAMPLE 16

| | | |
|---|---|---|
| sodium borohydride | 7.5 | g. |
| water (to make) | 1000 | ml. |
| sodium hydroxide (to pH 13) | | |

EXAMPLE 17

| | | |
|---|---|---|
| sodium borohydride | 10 | g. |
| dimethyl formamide | 1000 | ml. |

EXAMPLE 18

| | | |
|---|---|---|
| dimethylamine borane | 20 | g. |
| sodium hydroxide | 88 | g. |
| water (to make) | 1000 | ml. |

In all cases substrates metallized in selected areas according to this invention are obtained.

EXAMPLE 19

The procedure of Example 5 is repeated, substituting for the cupric gluconate solution, the following solution using ferric ammonium sulfate:

EXAMPLE 19

| | | |
|---|---|---|
| cupric acetate | 1.3 | g. |
| ferric ammonium sulfate | 3.5 | g. |
| pentaerythritol | 20 | g. |
| glycerol | 16 | g. |
| citric acid | 10 | g. |
| Surfactant 6G (Rohm & Haas Co.) | 0.3 | g. |
| water (to make) | 1000 | ml. |

A visible, real image is formed after a two minute exposure to the following solution:

| | | |
|---|---|---|
| dimethylamine borane | 1 | g. |
| sodium hydroxide | 37 | g. |
| water (to make) | 1000 | ml. |

EXAMPLES 20 and 20A

A clean, polarized epoxy-glass laminate (Example 2) is dip coated with a metal salt solution of the formula:

EXAMPLE 20

| | | |
|---|---|---|
| cupric formate | 10 | g. |
| anthraquinone 2,6-disulfonic acid disodium salt | 2 | g. |
| water | 1000 | ml. |
| glycerine | 10 | g. | and allowed to dry at 50°–60°C. for 5 minutes.

The substrate is exposed through a photographic negative to ultraviolet light for 1 to 2 minutes, forming a real image of copper. To build up the real image and to enhance contrast the substrate is then heated for 3 to 5 minutes at 130° to 140°C. No heating step is needed with the following alternative formulation:

EXAMPLE 20A

| | |
|---|---|
| cupric acetate | 8 g. |
| pentaerythritol | 50 g. |
| citric acid | 40 g. |
| anthraquinone 2,6-disulfonic acid disodium salt | 16 g. |
| stannous chloride | 0.5 g. |
| Surfactant 6G (Rohm & Haas) | 1 g. |
| water (to make) | 1000 ml. |

The unexposed portion of the surface layer is removed from the substrate by rinsing in water. The metallic image is built up by electrolessly depositing copper onto the substrate from a bath as described in Example 1.

Instead of selective exposure, paper is selectively covered by free hand printing with a design using the same metal salt as an ink. A real image of copper is formed after exposure to light, corresponding to the design. This is built up with an electroless copper deposit.

Instead of epoxy-glass laminates, paper, woven fabrics, cardboard, ceramics and glass can be used as the substrates.

Flexible printed circuits are made by this method as follows:

a. treat a bibulous paper or flexible plastic film substrate with the metal salt solution;
b. dry for 5 to 10 minutes at 60°C;
c. expose the dry coating through a negative to an ultraviolet light source;
d. develop or remove the unexposed metal salts under a warm water rinse;
e. immerse the treated paper of plastic film into an electroless copper solution and plate up to the desired thickness of metal;
f. neutralize the treated paper or film, wash and dry; and
g. coat the treated paper or film with a polymerizable resin and polymerize the resin.

In another variation of the process, the substrate is printed with the solution to form a circuit pattern, then exposed to ultraviolet light without a pattern to form a real image corresponding to the design. The metal is electrolessly deposited until a sufficient amount of metal has been built up to serve as a common cathode for electroplating. Alternatively, the base is covered all over with the metal salt coating and exposed to ultraviolet light without a pattern, a thin electroless metal plate is deposited to serve as a common cathode. Then, a negative print or mask is applied and the metal is built up by electrolytic plating. The background electroless metal can then be removed by a quick etch.

EXAMPLES 21–26

The procedure of Example 20 is repeated (without heating) substituting the following reducible salt solutions:

EXAMPLE 21

| | |
|---|---|
| cupric formate | 10 g. |
| anthraquinone 2,6-disulfonic acid disodium salt | 3 g. |
| water | 450 ml. |
| glycerine | 30 ml. |
| citric acid | 30 g. |
| stannous chloride | 1 g. |
| fluorocarbon wetting agent (3-M Co., FC-170) | 0.25 g. |

EXAMPLE 22

Prepare Part A:

| | |
|---|---|
| cupric gluconate | 15 g. |
| water | 200 g. |

Prepare Part B:

| | |
|---|---|
| fluorocarbon wetting agent (FC-170) | 0.1 g. |
| glycerine | 30 g. |
| citric acid | 30 g. |
| anthraquinone 2,6-disulfonic acid disodium salt | 2 g. |
| stannous chloride | 1 g. |
| water | 250 g. |

Mix A and B.

EXAMPLES 23 and 24

Prepare Part A:

| | | |
|---|---|---|
| cupric acetate | 15 g. | — |
| cupric nitrate | — | 15 g. |
| water | 200 g. | 200 g. |

Prepare Part B:

| | | |
|---|---|---|
| wetting agent (FC-170) | 0.25 g. | 0.25 g. |
| glycerine | 30 g. | 30 g. |
| citric acid | 30 g. | 30 g. |
| anthraquinone 2,6-disulfonic acid disodium salt | 3 g. | 3 g. |
| water | 250 g. | 250 g. |
| stannous chloride | 1 g. | 1 g. |

Mix A and B.

EXAMPLE 25

Prepare Part A:

| | |
|---|---|
| silver nitrate | 5 g. |
| water | 200 g. |

Prepare Part B:

| | |
|---|---|
| wetting agent (FC-180) | 0.25 g. |
| glycerine | 30 g. |
| citric acid | 30 g. |
| anthraquinone 2,6-disulfonic acid sodium salt | 3 g. |
| water | 250 g. |

Mix A and B.

EXAMPLE 26

| | |
|---|---|
| Palladium chloride | 1 g. |
| hydrochloric acid (37%) | 1 g. |
| glycerine | 16 ml. |
| anthraquinone 2,6-disulfonic acid disodium salt | 2 g. |
| water (to make) | 1 liter. |

EXAMPLE 27

The procedure of Example 20 is repeated, substituting for the copper salt solution, a silver salt solution:

| | |
|---|---|
| silver nitrate | 1 g. |
| acetone (to make) | 1000 ml. |

A real image comprising silver nuclei is produced. This is built up with a deposit of electroless copper.

EXAMPLES 28–29

The procedure of Example 20 is repeated, substituting for the cupric formate solution, the following solution using ferric ammonium sulfate as the sensitizer:

EXAMPLE 28

| | | |
|---|---|---|
| cupric acetate | 1.3 | g. |
| ferric ammonium sulfate | 3.5 | g. |
| pentaerythritol | 20 | g. |
| glycerol | 16 | g. |
| citric acid | 10 | g. |
| Surfactant 6G (Rohm & Haas Co.) | 0.3 | g. |
| water (to make) | 1000 | ml. |

A visible image of metallic nuclei is formed after a two minute exposure to ultraviolet light. The deposit can be deepened, if desired, by treating with the following solution:

| | |
|---|---|
| dimethylamine borane | 1 g. |
| sodium hydroxide | 37 g. |
| water (to make) | 1000 ml. |

The procedure is repeated substituting the following solution using L-ascorbic acid as the sensitizer:

EXAMPLE 29

| | | |
|---|---|---|
| cupric acetate | 4 | g. |
| L-ascorbic acid | 5 | g. |
| pentaerythritol | 25 | g. |
| sorbitol | 30 | g. |
| citric acid | 20 | g. |
| stannous chloride | 0.5 | g. |
| Surfactant 6G (Rohm & Haas Co.) | 0.5 | g. |
| water (to make) | 1000 | ml. |

In all cases, substrates metallized in selected areas according to this invention are obtained

EXAMPLE 30

The following process uses a metal salt composition which includes a metal accelerator.

A base polarized by the procedure of Example 2 is dipped for 2 minutes in a solution comprising:

| | | |
|---|---|---|
| cupric nitrate (Cu(NO$_3$)$_2$.19% H$_2$O) | 3 | g. |
| palladium chloride* | 25 | mg. |
| methanol (to make) | 1000 | ml. |

*PdCl$_2$ is added as a solution concentrate in HCl.

The base is air dried, then dipped for 2 minutes in a reducing solution of 1 g./l. of sodium borohydride in water. The base is rinsed for 2 to 5 minutes in overflow water and metallized by the procedure of Example 1. The following metal accelerators can be substituted for PdCl$_2$, at 0.4 g./l.; NiSO$_4$.6H$_2$O; FeSO$_4$.7H$_2$O; and Co(C$_2$H$_3$O$_2$)$_2$.4H$_2$O.

EXAMPLES 31–34

The procedure of Examples 1, 5 and 20 are repeated, substituting for the electroless copper solution, an electroless nickel solution:

EXAMPLE 31

| | |
|---|---|
| nickel chloride | 30 g. |
| sodium hypophosphite | 10 g. |
| glycollic acid | 25 g. |
| sodium hydroxide | 12.5 g. |
| water (to make) | 1000 ml. |

The pH is adjusted to 4.5 and the bath temperature is maintained at 95°C. A nickel layer is built up on the copper image.

The procedure of Examples 1, 5 and 20 are repeated, substituting for the electroless copper solution, an electroless cobalt solution:

EXAMPLE 32

| | |
|---|---|
| cobalt chloride | 30 g. |
| sodium hypophosphite | 20 g. |
| sodium citrate dihydrate | 29 g. |
| ammonium chloride | 50 g. |
| water (to make) | 1000 ml. |

The pH is adjusted to 9.5 and the bath temperature is maintained at 90°C. A cobalt layer is built up on the copper image.

The procedure of Examples 1, 5 and 20 is repeated, substituting for the electroless copper solution, an electroless gold solution:

EXAMPLE 33

| | |
|---|---|
| gold chloride hydrochloride trihydrate | 0.01 mole/l. |
| sodium potassium tartrate | 0.014 mole/l. |
| dimethylamine borane | 0.013 mole/l. |
| sodium cyanide | 0.4 g./l. |
| water | q.s.a.d. |

The pH is adjusted to 13 and the bath temperature is maintained at 60°C. A gold layer is built up on the copper image.

The procedure of Examples 1, 5 and 20 is repeated, substituting for the electroless copper solution, an electroless silver solution:

EXAMPLE 34

| | |
|---|---|
| silver nitrate | 1.7 g. |
| sodium potassium tartrate | 4.0 g. |
| sodium cyanide | 1.8 g. |
| dimethyl amine borane | 0.8 g. |
| water (to make) | 1000 ml. |

The pH is adjusted to 13 and the bath temperature is maintained at 80°C. A silver layer is built up on the copper image.

The non-conductive real images of nickel, cobalt, iron and silver prepared as described above can also be built up as described for the copper images in these examples with electroless nickel, cobalt, gold and silver.

All such images having a layer of electroless metal on top, can further be built up with an electroplated layer of copper, silver, gold, nickel, cobalt, tin, rhodium and alloys thereof, using the baths and conditions described hereinabove.

The above disclosure demonstrates that the present process provides for the selective reduction of a metal salt to metallic nuclei by means of radiant energy such as heat or light or by chemical reduction. The formation of a real image of a printed circuit or other type of pattern formation has been demonstrated both by printing and by selectively exposing the dry coating of the metal salt to U.V. radiation, through a negative in the presence of a light sensitive compound and a reducing agent. The positive, visible image has been shown to be catalytic to electroless metal deposition and this metal can be used to build up conductor thickness for increased current carrying capacity or to increase the thickness of the pattern. In contrast to prior art techniques, the metallic image produced by this process requires no additional development steps.

It is obvious that if the metal salt is reduced to its metallic state in the holes of a printed circuit substrate board, simultaneously with the circuit pattern being printed on the surface of the base material, the holes walls will be rendered catalytic to electroless metal deposition and there will be formed electrically interconnecting pathways for circuitry on both sides of the base materials.

It is possible to make interconnections through the holes, around the edges of the boards and through slots made in the base material. A unique advantage of the present process is that only the portion of the hole which is exposed to activation is sensitized and becomes catalytic. If, for example, a negative of a conductor line passes over a hole or a slot, a positive, slightly enlarged, catalyzed image will form on opposite sides of the hole walls. This permits electroless metal deposition to take place only on the exposed areas in the holes. It is possible in this way, with shading, for example, to make multiple connections through the same hole, thereby reducing the number of holes required to make interconnections of individual conductors from outside surfaces of the circuit boards.

Substrates can include epoxy-glass laminates, polyester film, ceramics, paper and the like. The direct bonding treatment described above provides a very active surface to which the metal salt strongly adsorbs and ultimately there is formed a strong bond between the base and the electrolessly deposited metal.

In addition to printed circuit boards, positive reproductions of photographs can be made from negatives onto paper and then metallized by electroless deposition. The process is capable of producing high resolution, and is not unduly sensitive to long exposures.

The invention in its broader aspects is not limited by the specific steps, methods, compositions and improvements shown and described herein, and departures may be made within the scope of the accompanying claims without departing from the principles thereof.

We claim:

1. In a process for selectively metallizing insulating substrates with real images, the steps which comprise depositing on said substrate a layer of a reducible metal composition by treating the substrate with a solution comprising a reducible salt of a non-noble metal, thereafter drying said layer, and exposing said dried layer to contact with a solution of a chemical reducing agent for the metal in said salt for a period sufficient to darken said layer and to reduce said metal salt to metallic nuclei thereof and wherein at least one of said treating and exposng steps is restricted to a selected pattern on said substrate to produce a non-conducting real image of said metallic nuclei in said selected pattern and capable of directly catalyzing the deposition thereon of metal from an electroless metal bath.

2. A process as defined in claim 1 wherein said substrate is a porous material.

3. A process as defined in claim 1 wherein said base is a non-metallic resinous base, the surface of which is polarized.

4. A process as defined in claim 1 wherein said salt is of the group consisting of reducible copper, nickel, cobalt and iron salts.

5. A process as defined in claim 1 wherein the deposition of said reducible metal composition is restricted to said selected patterns on said substrate.

6. A process as defined in claim 1 wherein the contact of said reducing agent solution is restricted to a selected pattern of said dried layer of reducible metal composition.

7. A process as defined in claim 1 wherein said substrate is thereafter exposed to an electroless metal bath to build up a layer of electroless metal on said image.

8. A process as defined in claim 1 wherein the said electroless metal is of the group consisting of copper, nickel, cobalt, gold and silver.

9. A process as defined in claim 7 wherein said substrate is rinsed after said reduction and prior to the exposure to said electroless metal bath.

10. A process as defined in claim 7 wherein said salt is of the group consisting of reducible salts of copper, nickel, cobalt and iron, and said electroless metal is of the group consisting of copper, nickel, cobalt, gold and silver.

11. A process as defined in claim 7, wherein said salt is a reducible copper salt and said electroless metal is copper.

12. A process as defined in claim 7 wherein said substrate is a non-metallic resinous substrate with a polarized surface.

13. A process as defined in claim 1 wherein said reducing agent is of the group consisting of alkali metal borohydrides, alkali metal hydrosulfites and aminoboranes.

14. A process as defined in claim 1 including the subsequent step of depositing electroplated metal on said electroless metal.

15. A process as defined in claim 1 including the subsequent step of depositing electroplated copper, nickel, cobalt, gold or silver on said electroless copper, nickel, cobalt, gold or silver.

16. A process as defined in claim 1 including the subsequent step of depositing electroplated copper, nickel, cobalt, gold or silver on said electroless copper, nickel, cobalt, gold or silver.

17. A new article of manufacture comprising a non-metallic substrate and in selected areas on or in said base a layer, said layer being in the form of a real image comprising reduced non-noble metal nuclei and on said image a layer of electroless metal or a layer of electroless metal on top of which is layer of electroplated metal.

18. An article as defined in claim 17 wherein said substrate comprises a non-metallic resinous base, the surface of which is polarized.

19. An article as defined in claim 17 wherein said reduced non-noble metal nuclei are copper, nickel, cobalt or iron nuclei.

20. An article as defined in claim 17 wherein said electroless metal is copper, nickel, cobalt, gold or silver.

21. An article as defined in claim 20 wherein said electroplated metal is copper, nickel, cobalt, gold or silver.

* * * * *